(12) United States Patent
Zhang et al.

(10) Patent No.: US 11,832,427 B2
(45) Date of Patent: Nov. 28, 2023

(54) METHOD FOR REDUCING COUPLING SENSITIVITY DEVIATION, TERMINAL, AND APPARATUS WITH STORAGE FUNCTION

(71) Applicant: HuiZhou TCL Mobile Communication Co., Ltd., HuiZhou (CN)

(72) Inventors: Sheng Zhang, HuiZhou (CN); Zhihao Zheng, HuiZhou (CN)

(73) Assignee: HuiZhou TCL Mobile Communication Co., Ltd., HuiZhou (CN)

( * ) Notice: Subject to any disclaimer, the term of this patent is extended or adjusted under 35 U.S.C. 154(b) by 520 days.

(21) Appl. No.: 17/190,643

(22) Filed: Mar. 3, 2021

(65) Prior Publication Data
US 2021/0185863 A1    Jun. 17, 2021

Related U.S. Application Data

(63) Continuation of application No. PCT/CN2019/111399, filed on Oct. 16, 2019.

(30) Foreign Application Priority Data

Oct. 24, 2018   (CN) .......................... 201811243855.1

(51) Int. Cl.
*H04B 1/18* (2006.01)
*H05K 9/00* (2006.01)
(Continued)

(52) U.S. Cl.
CPC ............. *H05K 9/0024* (2013.01); *H04B 1/40* (2013.01); *H04B 17/318* (2015.01); *H04M 1/0277* (2013.01)

(58) Field of Classification Search
CPC ...... H04B 1/40; H04B 17/336; H04B 17/345; H04B 17/346; H04B 17/373; H04M 1/0277; H05K 9/0024

See application file for complete search history.

(56) References Cited

U.S. PATENT DOCUMENTS 8,626,101 B2 * 1/2014 Stallman .............. H04B 7/0814
                                                                         455/272
8,688,159 B1 * 4/2014 Singh .................. H04B 17/318
                                                                       455/226.1

(Continued)

FOREIGN PATENT DOCUMENTS

| CN | 101873184 | 10/2010 |
|----|-----------|---------|
| CN | 103297161 | 9/2013  |

(Continued)

OTHER PUBLICATIONS

Di "The EMI Problems and the Case Analysis in a New Generation of Mobile Phone Design", Engineering Science & Technology, Chinese Master's Theses Full-Text Database; No. No. 6; Jun. 15, 2015.

*Primary Examiner* — Nhan T Le

(57) ABSTRACT

A method and terminal for reducing coupling sensitivity deviations, and an apparatus having a storage function are provided. Sensitivities of different channels are collected to obtain sensitivity deviations between adjacent channels when a sample smart terminal is at a first predetermined position. It is determined whether one of the sensitivity deviations is greater than a predetermined deviation threshold. If one of the sensitivity deviations is greater than the predetermined deviation threshold, it is determined whether a cause of the sensitivity deviation comprises a signal scattering effect and/or a signal radiation effect. A smart terminal is then produced according to determination of the cause.

20 Claims, 2 Drawing Sheets

(51) Int. Cl.
*H04B 17/318* (2015.01)
*H04B 1/40* (2015.01)
*H04M 1/02* (2006.01)

(56) References Cited

U.S. PATENT DOCUMENTS

| | | | |
|---|---|---|---|
| 9,236,959 B2 | 1/2016 | Bai | |
| 9,515,378 B2* | 12/2016 | Prasad | H01Q 3/26 |
| 9,577,609 B2* | 2/2017 | Jaisimha | H04B 1/1638 |
| 11,211,959 B2* | 12/2021 | Balakrishnan | H04B 1/10 |
| 2017/0054836 A1 | 2/2017 | Chung et al. | |

FOREIGN PATENT DOCUMENTS

| | | |
|---|---|---|
| CN | 106162722 | 11/2016 |
| CN | 106253996 | 12/2016 |
| CN | 106713574 | 5/2017 |
| CN | 107276686 | 10/2017 |
| CN | 107454215 | 12/2017 |
| CN | 109586748 | 4/2019 |
| CN | 106686166 | 7/2021 |
| JP | 2005-230096 | 9/2005 |
| KR | 2009-0100581 | 9/2009 |

* cited by examiner

Sensitivities of different channels are collected when a sample smart terminal is at a first predetermined position to obtain sensitivity deviations between adjacent channels; where the first predetermined position is a position where the signal strength received by the sample smart terminal antenna is at the maximum level.

↓ 101

Among the sensitivity deviations between adjacent channels, it is determined whether one of the sensitivity deviations is greater than a predetermined deviation threshold.

↓ 102

If a sensitivity deviation is greater than the predetermined deviation threshold, it is determined whether the cause of the sensitivity deviation includes a signal scattering effect and/or a signal radiation effect, so that a smart terminal is produced accordingly.

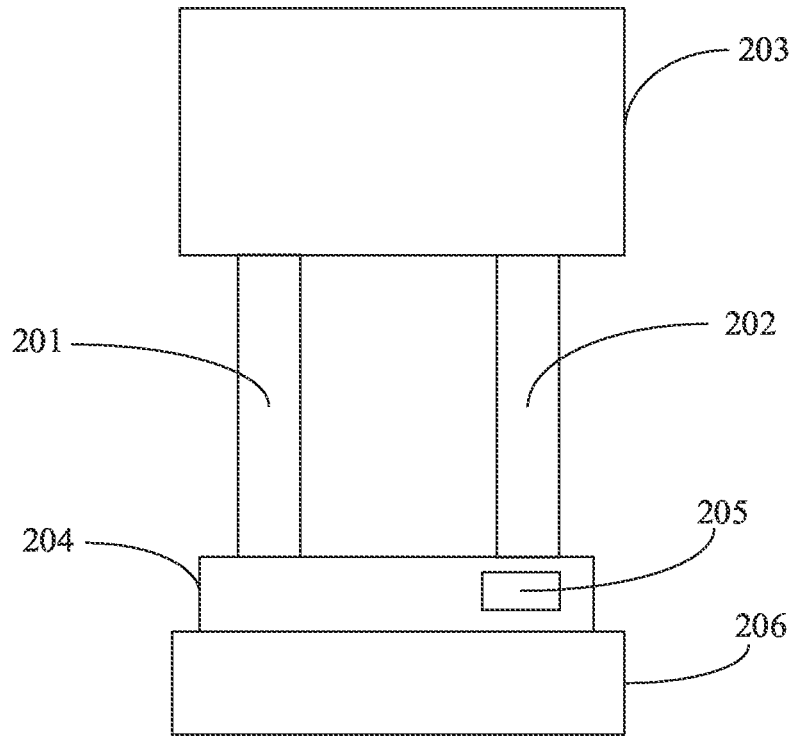

FIG. 2

METHOD FOR REDUCING COUPLING SENSITIVITY DEVIATION, TERMINAL, AND APPARATUS WITH STORAGE FUNCTION

CROSS REFERENCE TO RELATED APPLICATIONS

This application is a US national phase bypass application based on an international application No. PCT/CN2019/111399 which requests priority of the patent application filed on Oct. 24, 2018 with the National Intellectual Property Administration, application number 201811243855.1, titled "Method for reducing coupling sensitivity difference, terminal, and apparatus with storage function", which is incorporated by reference in the present application in its entirety.

BACKGROUND

The present application relates to telecommunication field, and in particular, to a method and terminal for reducing coupling sensitivity deviation, and an apparatus with storage function.

Coupling sensitivity deterioration in a mobile terminal refers to a phenomenon of audio quality deterioration or even dropped calls due to external interference sources when the mobile terminal is under weak signal conditions. The coupling sensitivity deterioration is characterized by three major elements in electromagnetic compatibilities: interference sources, interference paths, and susceptible devices. The interference source mainly comes from high level harmonics of digital signals (26 MHZ frequency multiplication signal); the interference path is mainly established from metal materials in mobile phones (flexible circuit boards in displays, motors, large/small flexible circuit boards) or metal-like semiconductors (such as batteries, graphite sheet); and the susceptible device can be a mobile phone antenna.

The coupling sensitivity deterioration in the mobile terminal generally occurs only in individual channels and does not reduce a total reception level of the antenna of the mobile terminal. Under normal circumstances, channel quality feedback from a base station is used to refrain from assigning coupling sensitivity deteriorated channels to users. The computation power of the base station, however, is limited. It is impossible to reallocate resources under busy conditions, rendering poor connection qualities for individual users. Conventional solutions comprise: wrapping up all clock cables around the interference source with ground lines, reserving capacitance spaces around power supply areas of T card, SIM card, and camera, coating the flexible circuit board with an electromagnetic shielding film, and grounding the motor at the interference path, and/or enhancing the conduction sensitivity and antenna efficiency of susceptible devices. All the described approaches can only reduce sensitivity deviations caused by radiation, but cannot reduce those caused by a signal scattering effect. Therefore, it is necessary to propose a method and terminal for reducing coupling sensitivity deviations, and an apparatus with storage function to solve the above technical problems.

The present application provides a method and terminal for reducing coupling sensitivity deviations, and an apparatus with storage function implementing the method. The method for reducing coupling sensitivity deviations in the present application can reduce the deteriorations of coupling sensitivity induced by the signal scattering effect.

SUMMARY

To solve the described technical issues, a first technical solution of the application proposes a method for reducing the sensitivity deviation comprising steps as follows. Sensitivities of different channels are collected to obtain sensitivity deviations between adjacent channels when a sample smart terminal is at a first predetermined position. The first predetermined position is a position where a maximum signal strength can be acquired by an antenna of the sample smart terminal. It is determined whether one of the sensitivity deviations is greater than a predetermined deviation threshold. If one of the sensitivity deviations is greater than the predetermined deviation threshold, it is determined whether a cause of the sensitivity deviation comprises a signal scattering effect and/or a signal radiation effect. Thereafter, a smart terminal is produced according to determination of the cause.

In an embodiment of producing the smart terminal according to determination of the cause, if the cause comprises the signal scattering effect, a metal film in a flexible circuit board of the smart terminal is redesigned to have a first thickness less than a skin effect depth of the metal film.

In the embodiment, the at least one metal film in the flexible circuit board is a copper film; and the first thickness is not greater than 0.2 mm.

The flexible circuit board may comprise a display flexible circuit board and/or large/small flexible circuit boards of the smart terminal.

In a further embodiment, before reducing a thickness of at least one metal film in a flexible circuit board of the sample smart terminal if the cause comprises the signal scattering effect, a dominant signal scattering path from the display flexible circuit board and the large/small flexible circuit boards is determined after determining that the cause of the sensitivity deviation comprises the signal scattering effect. The metal film is deployed in the display flexible circuit board when the display flexible circuit board is determined as the dominant signal scattering path. The metal film is deployed in the large/small flexible circuit board when the large/small flexible circuit board is determined as the dominant signal scattering path.

In an embodiment of producing the smart terminal according to determination of the cause, if the cause is determined as comprising the signal scattering effect, a metal film in a flexible circuit board of the smart terminal is replaced with a different metal film having a product of magnetic permeability and electric conductivity less than a preset value, and a skin effect depth greater than that of the metal film.

In a further embodiment of producing the smart terminal according to determination of the cause, if the cause is determined as comprising the signal radiation effect, a flexible circuit board of the smart terminal is coated with an electromagnetic shielding film, and a motor in the smart terminal is grounded.

In a further embodiment of producing the smart terminal according to determination of the cause, if the cause is determined as comprising the signal radiation effect, all clock cables in the flexible circuit board of the smart terminal are wrapped up, and a ground capacitance is added in parallel to a power line in the smart terminal.

In a further embodiment of producing the smart terminal according to determination of the cause, if the cause is determined as comprising the signal scattering effect and the signal radiation effect, the flexible circuit board of the smart terminal is coated with an electromagnetic shielding film, a motor is grounded, and a metal film in a flexible circuit board of the smart terminal is redesigned to have a first thickness less than a skin effect depth of the metal film.

In a further embodiment of producing the smart terminal according to determination of the cause, sensitivity deviations between adjacent channels are collected when the sample smart terminal is at the first predetermined position after coating a flexible circuit board of the sample smart terminal with an electromagnetic shielding film and grounding a motor. It is then determined whether one of the sensitivity deviations is greater than the predetermined deviation threshold. The cause is deemed as comprising the signal scattering effect if the predetermined deviation threshold is exceeded by one of the sensitivity deviations. The cause is deemed as comprising the signal radiation effect if the predetermined deviation threshold is not exceeded by one of the sensitivity deviations.

In an embodiment, sensitivities of different channels are collected when the sample smart terminal is in a screen-off state.

A second technical solution proposes a terminal to attend to the described tech issues. The terminal is configured to produce a smart terminal with reduced sensitivity deviations, comprising a signal collector and a processor coupled to each other. The signal collector collects sensitivities of different channels to obtain sensitivity deviations between adjacent channels when the sample smart terminal is at a first predetermined position; wherein the first predetermined position is a position where a maximum signal strength can be acquired by an antenna of the sample smart terminal. The processor determines whether one of the sensitivity deviations is greater than a predetermined deviation threshold. The processor determines whether a cause of the sensitivity deviation comprises a signal scattering effect and/or a signal radiation effect if one of the sensitivity deviations is determined as greater than the predetermined deviation threshold. The processor drives a smart terminal production process to produce the smart terminal according to determination of the cause.

It is known that a smart terminal production process involves thousands of processes, designs, deployments, materials and tools. The smart terminal production process referred in the application merely illustrates essential steps relevant to the embodiments, while the other parts are considered as known by the professionals in the art and would not be discussed in detail herein.

In a further embodiment of the terminal, if the processor determines that the cause comprises the signal scattering effect, the processor redesign a metal film in a flexible circuit board of the smart terminal to have a first thickness less than a skin effect depth of the metal film, and the processor drives the smart terminal production process to deploy the metal film in the flexible circuit board of the smart terminal.

In a further embodiment of the terminal, if the processor determines the cause as comprising the signal scattering effect, the processor drives the smart terminal production process to a metal film in a flexible circuit board of the smart terminal with a different metal film having a product of magnetic permeability and electric conductivity less than a preset value, and a skin effect depth greater than that of the metal film.

In a further embodiment of the terminal, if the processor determines the cause as comprising the signal radiation effect, the processor further drives the smart terminal production process to coat the flexible circuit board of the smart terminal with an electromagnetic shielding film and connect a motor to the ground.

In a further embodiment of the terminal, the signal collector collects sensitivity deviations between adjacent channels when the smart terminal is placed at the first predetermined position after a flexible circuit board of the sample smart terminal is coated with an electromagnetic shielding film and a motor in the sample smart terminal is grounded. The processor determines whether one of the sensitivity deviations is greater than the predetermined deviation threshold, deems the cause as comprising the signal scattering effect if the predetermined deviation threshold is exceeded by one of the sensitivity deviations, and deems the cause as comprising the signal radiation effect if the predetermined deviation threshold is not exceeded by one of the sensitivity deviations.

In a further embodiment of the terminal, the sample smart terminal is in a screen-off state when the signal collector collects sensitivities of different channels.

To solve the above technical problems, a third technical solution proposed in the present application is a device with a storage function that stores program data executable to perform the steps of collecting sensitivities of different channels to obtain sensitivity deviations between adjacent channels when a sample smart terminal is at a first predetermined position; wherein the first predetermined position is a position where a maximum signal strength can be acquired by an antenna of the sample smart terminal; determining whether one of the sensitivity deviations is greater than a predetermined deviation threshold; determining whether a cause of the sensitivity deviation comprises a signal scattering effect and/or a signal radiation effect if one of the sensitivity deviations is greater than the predetermined deviation threshold; and producing a smart terminal according to determination of the cause.

The beneficial effects of the application are as follows. Unlike the situation in the prior art, the present application collects the sensitivity of different channels from a sample smart terminal positioned at the first predetermined position, obtains the sensitivity deviation between adjacent channels, and determines whether the sensitivity deviation between adjacent channels is greater than the predetermined deviation threshold. It is further determined whether the cause of the sensitivity deviation includes the signal scattering effect and/or a signal radiation effect, and the smart terminal is produced according to the determination result, in which the coupling sensitivity deteriorations caused by the signal scattering effect is thereby reduced.

BRIEF DESCRIPTION OF THE DRAWINGS

The present invention can be more fully understood by reading the subsequent detailed description and examples with references made to the accompanying drawings.

FIG. 1 is a flowchart of a method for reducing coupling sensitivity deviation according to an embodiment of the present application.

FIG. 2 is a schematic structural diagram of a sample smart terminal according to an embodiment of the present application.

DETAILED DESCRIPTION

Figure 3:
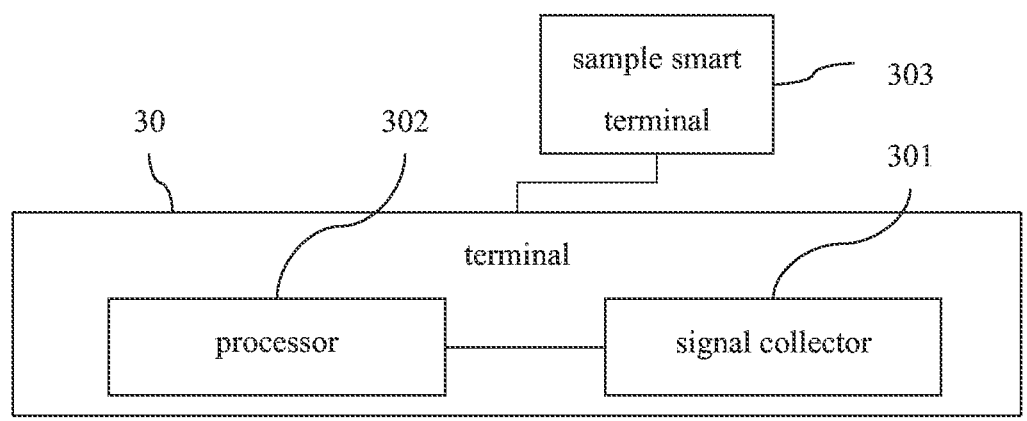
FIG. 3 is a schematic structural diagram of a terminal for reducing coupling sensitivity deviation according to an embodiment of the present application.

The following description is of the best-contemplated mode of carrying out the invention. The description is made for the purpose of illustrating the general principles of the invention and should not be taken in a limiting sense. The scope of the invention is best determined by reference to the appended claims.

To make clear the purpose, technical solutions and technical effects of the application, embodiments of the application are described in further detail. It shall be understood that the specific implementation regulations described here are only used to explain the application and not to limit the application.

Generally, the problem of coupling sensitivity deterioration due to radiation is reduced through interference sources, interference paths, and susceptible devices. As it is difficult to determine the interference source, and when the receiving sensitivity of the susceptible device is improved, it may lead to easier reception of 26 MHz frequency multiplication signals, that is, the overall sensitivity may not be optimized, hence, the problem is often processed at the interference path. In the prior art, processing at the interference source, interference path, and susceptible device can only reduce the problem of coupling sensitivity deterioration due to radiation, but cannot reduce the coupling sensitivity deterioration due to a signal scattering effect. In order to reduce the coupling sensitivity deterioration caused by scattering, the present application first determines whether the cause of the sensitivity deviation includes the signal scattering effect and/or the signal radiation effect, and produces a smart terminal according to the determination result, such that the coupling sensitivity deterioration caused by the signal scattering effect in the produced smart terminal is reduced.

The application only considers the coupling sensitivity deterioration caused by a signal radiation effect and/or a signal scattering effect, and the coupling sensitivity deterioration caused by other reasons is not within the scope of the application. In the following embodiments, a 26 MHz frequency multiplication signal interference source is employed as an example for detailed description. The 26 MHz frequency multiplication signal has various high-level harmonics that can serve as the main interference sources.

FIG. 1 is a schematic flowchart of a method for reducing a coupling sensitivity deviation according to an embodiment of the application. Three steps are presented as follows.

In step 101, sensitivities of different channels are collected when a sample smart terminal is at a first predetermined position to obtain sensitivity deviations between adjacent channels; wherein the first predetermined position is a position where the signal strength received by a sample smart terminal antenna is at the maximum level.

The sample smart terminal is put in the shielding box. The shielding box is advantageous for the capabilities of shielding external interference, flexibility for moving the test position, and better reception performance with a flat panel antenna. A comprehensive measuring instrument is arranged outside the shielding box, connected to the sample smart terminal for displaying the signal received by the sample smart terminal antenna and transmitted by the flat panel antenna, to facilitate observation and recording.

The plate antenna in the shielding box transmits the signal, and the sample smart terminal antenna receives the signal, and the received signal strength is displayed by the comprehensive tester. The sample smart terminal is moved to change the relative positions between the sample smart terminal antenna and the plate antenna, to obtain the relationship between the received signal strength and the position change between the sample smart terminal antenna and the plate antenna. A position corresponding to the maximum received signal strength is selected as a first predetermined position, and the sample smart terminal is then placed thereon. Theoretically, the position with the highest received signal strength corresponds to the position where the sample smart terminal antenna is expected to receive the strongest interference signal and reflect the most extent of the coupling sensitivity. Locating the first predetermined position is therefore the first thing to do, and thereafter, the sample smart terminal is placed at the first predetermined position, and the sensitivity of different channels can be collected more accurately.

In an embodiment, the sample smart terminal placed in the shielding box is in the screen-off state, that is, the sensitivities of the sample smart terminal in different channels at the first predetermined position are collected when the sample smart terminal is in the screen-off state.

After collecting the sensitivity of different channels when the sample smart terminal is at the first predetermined position, the sensitivity deviations between the 26 MHz frequency multiplication channel and adjacent channels are acquired.

In a specific embodiment, taking GSM1800 as an example, the sensitivity of the 26 MHz frequency multiplication channel CH586 of GSM1800 is −105 dB, the sensitivity of the CH585 channel adjacent to CH586 is −112.5 dB, and the sensitivity deviation between CH586 and CH585 is 7.5 dB. The sensitivity of the 26 MHZ frequency multiplication channel CH716 is −105.5 dB, the sensitivity of the CH715 channel adjacent to the CH716 is −113 dB, and the sensitivity deviation between the CH716 and CH715 is 7.5 dB. The sensitivity of the 26 MHZ frequency multiplication channel CH846 is −108 dB. The sensitivity of the adjacent CH845 channel is −111.5 dB, and the sensitivity deviation between CH846 and CH845 is 3.5 dB. Sensitivities of different channels are recorded and stored, and the sensitivity deviations between the 26 MHz frequency multiplication channel and its adjacent channels are obtained.

In one embodiment, the sample smart terminal is placed in a shielding box in a specific implementation manner. In another embodiment, the sample smart terminal may also be placed in a triangular cone or other devices, which is not specifically limited in the present application.

In Step 102, among the sensitivity deviations between adjacent channels, it is determined whether one of the sensitivity deviations is greater than a predetermined deviation threshold.

Generally, the sensitivity deviation between the 26 MHz frequency multiplication channel and its adjacent channel is compared with a predetermined deviation threshold. When the sensitivity deviation is greater than the predetermined deviation threshold, the signal scattering effect and/or the signal radiation effect is deemed detected, conversely, no signal scattering/radiation effect is detected when the predetermined deviation threshold is not exceeded.

For example, a predetermined deviation threshold of 3 dB is selected to be compared with the sensitivity deviation. If the sensitivity deviation is greater than 3 dB, the subsequent steps are processed to further determine whether the cause of the sensitivity deviation includes the signal scattering effect.

In a specific embodiment, a sensitivity deviation between CH586 and CH585 is 7.5 dB greater than 3 dB, a sensitivity deviation between CH716 and CH715 is 7.5 dB greater than 3 dB, and a sensitivity deviation between CH846 and CH845 is 3.5 dB greater than 3 dB, showing a positive sign of the signal scattering effect and/or the signal radiation effect. The greater sensitivity deviation between the 26 MHz frequency multiplication channel and its adjacent channel, the worse the coupling sensitivity deteriorates, that is, the coupling sensitivity of the 26 MHz frequency multiplication channels CH586 and CH716 of GSM1800 is deteriorated. The deterioration between CH586/CH716 in this case is greater than that between CH846/CH845.

The predetermined deviation threshold selected in the embodiment is 3 dB, and the predetermined deviation threshold in other embodiments may also be other values, which is not specifically limited herein.

In Step 103, if there is a sensitivity deviation greater than the predetermined deviation threshold, it is determined whether the cause of the sensitivity deviation includes a signal scattering effect and/or a signal radiation effect, so that a smart terminal is produced by a smart phone production process accordingly. It is known that a smart terminal production process involves thousands of processes, designs, deployments, materials and tools. The smart terminal production process referred in the application merely illustrates essential steps relevant to the embodiments, while the other parts are considered as known by the professionals in the art and would not be discussed in detail herein.

The sensitivity deviation is compared with the predetermined deviation threshold 3 dB. When the sensitivity deviation is greater than 3 dB, a treatment process is performed on the sample smart terminal by applying an electromagnetic shielding film to the flexible circuit board and connecting the motor to the ground. Sensitivity deviations of the treated sample smart terminal is collected again at the first predetermined position. It is determined whether there is a sensitivity deviation greater than a predetermined deviation threshold among the adjacent channels. If so, it is determined whether the cause of the sensitivity deviation includes the signal scattering effect. Otherwise, it is determined whether the cause of the sensitivity deviation includes the signal radiation effect.

In a specific embodiment, a sensitivity deviation between CH586 and CH585 is 7.5 dB, a sensitivity deviation between CH716 and CH715 is 7.5 dB, and a sensitivity deviation between CH846 and CH845 is 3.5 dB. A treatment process is performed on the sample smart terminal by coating the flexible circuit board of the sample smart terminal with an electromagnetic shielding film and connecting the motor to the ground. In the treated sample smart terminal, the sensitivity deviation between CH586 and CH585 is 5.5 dB, the sensitivity deviation between CH716 and CH715 is 5.5 dB, and the sensitivity deviation between CH846 and CH845 is 1.5 dB. Since the sensitivity deviation is reduced to 5.5 dB but still greater than the predetermined deviation threshold 3 dB after the treatment process, it is confirmed that the causes of the sensitivity deviation include the signal scattering effect and the signal radiation effect.

After determining that the causes of sensitivity deviation include the signal scattering effect and the signal radiation effect, a smart terminal production process is configured and driven to coat the flexible circuit board with an electromagnetic shielding film, and connect the motor to the ground. A redesign process is performed on a metal film in the flexible circuit board of a smart terminal, i.e., by reducing thickness of the metal film, to manufacture a metal film having a thickness thinner than its own skin effect depth.

When an alternating current pass through a metal conductor, the current is unevenly distributed on the cross-section of the metal conductor. The current density on the surface is greater than the density inside the core, and the higher frequency of the alternating current, the more obvious the tendency is. Such a phenomenon is referred to as a skin effect that would cause extremely high density of free electrons on the surface of the metal conductor. When a high-frequency electromagnetic field hits the free electrons on the surface, the electromagnetic field is scattered in all directions known as the signal scattering effect, and consequently it is difficult for the transmitted signal to pass through the metal conductor. The flexible circuit board in the application is a metal conductor. When the skin effect occurs, high-frequency electromagnetic fields hit the surface of the flexible circuit board, which may cause the signal scattering effect. That is, a signal scattering effect is referred to as a secondary reflection generated by an interference signal hitting the metal surface by the signal radiation effect, whereas the signal radiation effect is referred to as an electromagnetic field emitted when the interference signal is conducted through the interior of the metal body.

If the skin effect depth is greater than the thickness of the metal film in the flexible circuit board, the electromagnetic field can be transmitted into the flexible circuit board without being scattered in all directions, which changes the direction of the electromagnetic field and the interference path, weakening the reception level of the interference signal received by a sample smart terminal antenna. That is, when the skin effect depth is greater than the thickness of the metal film, the skin effect can be suppressed as well as the signal scattering effect. When the interference signal hits a surface of the flexible circuit board, the interference signal passes through the surface without changing the direction, and therefore no secondary signal scattering effect is induced.

The skin effect depth t is calculated by the following formula (1):

$$t = \sqrt{\frac{2}{abc}} \quad (1)$$

wherein a represents angular frequency, b represents magnetic permeability, and c represents electrical conductivity. The angular frequency a is calculated by the following formula (2):

$$a = 2\pi f \quad (2)$$

Wherein f represents the frequency of the induced current.

The flexible circuit board includes two layers, an upper metal film and a lower metal film. In the embodiment, the upper and lower metal films are made of copper. The frequency f of the induced current is selected to be 100 KHZ, and the known magnetic permeability of copper is $4\pi*10^{-7}$ H/m, the electrical conductivity of copper is $5.8*10^7$ Ωm, and the skin effect depth t is calculated to be 0.2 mm when substituted into equations (1) and (2). Experiments show that by deploying at least one thickness reduced copper film in the flexible circuit board, i.e., a copper film of no more than 0.2 mm, the sensitivity deviation caused by the signal scattering effect can be reduced.

In an embodiment of a smart terminal production process, thickness of a metal film in the flexible circuit board is made less than the skin effect depth of the metal film by deploying a thickness reduced copper film, such that the sensitivity deviation caused by the signal scattering effect can be reduced. In an alternative embodiment of the smart terminal production process, a metal film of different material featuring an increased skin effect depth may be deployed in the flexible circuit board in replacement of the original metal film to reduce the sensitivity deviation caused by the signal scattering effect.

In a specific embodiment of the smart terminal production process, if the cause of the sensitivity deviation is determined to include the signal scattering effect, at least one metal film in the flexible circuit board of the sample smart terminal is replaced with a metal film having a product of magnetic permeability and electrical conductivity less than a preset value, wherein the skin effect depth of the replaced metal film is greater than the thickness of the metal film. For example, in a flexible circuit board, the metal film made of a copper film is replaced with a metal film made of a gold film or a silver film, and the thickness of the gold film or silver film after replacement is the same as the thickness of the copper film before replacement. The thickness of the copper film before replacement is ti. Since a product of the magnetic permeability and the electrical conductivity of the gold film or silver film is smaller than those of the copper film, the skin effect depth of the gold film or the silver film is greater than that of the copper film according to formula (1). By replacing the material of the metal film, the skin effect depth of the replaced gold or silver film is greater than the thickness ti, so that the sensitivity deviation caused by the signal scattering effect can be reduced.

The above embodiments are cases where the signal caused by the sensitivity deviation includes both the signal radiation effect and the signal scattering effect. In other cases, the cause of the sensitivity deviation may include only the signal radiation effect.

Specifically, when the sample smart terminal is in the first predetermined position, the sensitivity of different channels is collected to obtain the sensitivity deviation between the 26 MHz frequency multiplication channel and its adjacent channel; if there is a sensitivity deviation greater than the predetermined deviation threshold in the sensitivity deviation, a treatment process is performed to coat the flexible circuit board in the sample smart terminal electromagnetic shielding film and connect the motor to the ground. Sensitivity deviations are collected and checked again after the treatment process. If the sensitivity deviation of the 26 MHZ frequency multiplication channel and its adjacent channel after the treatment process is less than the predetermined deviation threshold, it is determined that the cause of the sensitivity deviation includes only the signal radiation effect. In a smart terminal production process, the sensitivity deviation can be reduced by simply coating the flexible circuit board of the sample smart terminal with an electromagnetic shielding film and connecting the motor to the ground.

In another case, the cause of the sensitivity deviation may only include the signal scattering effect. Specifically, when the sample smart terminal is in the first predetermined position, sensitivities of different channels are collected to obtain the sensitivity deviation between the 26 MHz frequency multiplication channel and its adjacent channel. If a sensitivity deviation greater than the predetermined deviation threshold in the sensitivity deviation, a treatment process is performed on the sample smart terminal to coat the flexible circuit board with electromagnetic shielding film and connect the motor to the ground. The sensitivities of different channels are collected on the treated sample smart terminal again. If the sensitivity deviation of 26 MHZ frequency multiplication channel and its adjacent channel remains unchanged after the treatment process, the cause of the sensitivity deviation is deemed to be only the signal scattering effect. In the smart terminal production process, the sensitivity deviation can be reduced by simply deploying a thickness reduced metal film or a different material metal film featuring a product of permeability and electrical conductivity less than a preset value.

By coating the flexible circuit board with an electromagnetic shielding film at the interference path and grounding the motor, the sensitivity deviation caused by the signal radiation effect can be reduced. Specifically, the electromagnetic signals transmitted in the flexible circuit board will generate interleaved electric and magnetic fields around the flexible circuit board, and the transmission path can be blocked by the coating on the electromagnetic shielding film. The positive and negative electrode power of the motor may amplify the clock signal. If the surface of the motor is well connected to the ground, the ground interference signals can be smoothly dispatched, thereby reducing the sensitivity deviation.

In addition to applying an electromagnetic shielding film to the flexible circuit board at the interference path and grounding the motor, the sensitivity deviation can also be reduced by wrapping up all the clock cables around the source of the interference, and reserving spaces at the power supply areas of the T card, SIM card, and the camera for installation of a capacitance device. By wrapping up it means that the clock cables are isolated from other cables. Generally, the 26 MHz frequency multiplication signal of the clock is amplified and output by a power supply, so it is necessary to filter out the adjacent power signal, and reserve enough space around the power supplies of T-card, SIM card, and camera to install a capacitor. Energy of the clock signal is relatively insignificant; however, it might be amplified after coupling to a power supply. Thus, it is necessary to add a parallel grounded capacitor on the power line to filter out interferences caused by the frequency multiplication signal to reduce the coupling sensitivity deterioration caused by the signal radiation effect.

In an additional embodiment of the smart terminal production process, the conduction sensitivity and antenna efficiency can also be improved at the susceptible device. Increasing the conduction sensitivity and antenna efficiency can optimize the overall sensitivity to a certain extent, however, if the smart terminal antenna is more susceptible for the 26 MHZ frequency multiplication signal due to the improvement of the smart terminal antenna efficiency, such an improvement may not necessarily render positive effects on the overall performance. The result is dependent on actual implementations.

Flexible circuit boards in a smart terminal comprise at least a display flexible circuit board and/or a large/small flexible circuit board. When the signal scattering effect is detected as the cause of the sensitivity deviation, while the sensitivity deviation is reduced by deploying a thickness reduced metal film in the flexible circuit board, a main interference path causing the signal scattering effect can further be identified from either the display flexible circuit board or the large/small flexible circuit board.

FIG. 2 is a schematic structural diagram of a sample smart terminal based on an embodiment of the present application. As shown in FIG. 2, both ends of the display flexible circuit board 201 and the large/small flexible circuit board 202 are respectively connected to the main board 203 and the small board 204. The main board 203 is a display panel, and the small board 204 is provided with a motor 205. A smart terminal antenna 206 is arranged adjacent to the small board 204. The small board 204 is a printed circuit board (PCB) area with a relatively small space, including a USB connector, an antenna tuner, etc. The large board is a large PCB area with relatively large space, including a radio frequency device, a CPU, a memory, a camera, and so on. The sample smart terminal is in an off-screen state, that is, the main board 203 is not displayed, and no signal is displayed in the display flexible circuit board 201.

When it is determined that the cause of the sensitivity deviation includes the signal scattering effect, the display flexible circuit board 201 is removed from the sample smart terminal, and the sensitivity of different channels when the sample smart terminal is at the first predetermined position is collected again. If the sensitivity deviation between the channel and its adjacent channel is less than the predetermined deviation threshold, the dominant signal scattering path is confirmed to be the display flexible circuit board 201. In that case, only a metal film in the display flexible circuit board 201 is required to be redesigned with a reduced thickness when a subsequent smart terminal production process is performed to produce a smart terminal. If the sensitivity deviation between the 26 MHZ frequency multiplication channel and its adjacent channel is basically unchanged at the time, the dominant signal scattering path is identified to be the large/small flexible circuit board 202. In that case, only a metal film in the large/small flexible circuit board 202 is required to be redesigned with a reduced thickness when the subsequent smart terminal production process is performed to produce the smart terminal.

After determining that the cause of the sensitivity deviation includes the signal scattering effect, it is further determined whether the display flexible circuit board or the large/small flexible circuit board is the dominant signal scattering path. Since only a metal film corresponding to the dominant signal scattering path requires a redesign process to reduce its thickness, the smart terminal production process is simplified while the cost is reduced. In other embodiment of the smart terminal production process, the metal film of the dominant signal scattering path may be replaced with a metal film with a product of magnetic permeability and electrical conductivity less than a preset value.

In above embodiments, the 26 MHz frequency multiplication signal is used as an example for explanation. In some alternative cases, the interference source may also be other types of interference sources, such as a backlight IC body, an LCD internal driving IC body, etc. The actual implementation is not specifically limited herein.

The beneficial effects of the present application are as follows. Unlike prior arts, embodiments of the present application collect the sensitivity of different channels when the sample smart terminal is at the first predetermined position, obtain the sensitivity deviations between adjacent channels, and determine whether a sensitivity deviation between adjacent channels is greater than the predetermined deviation threshold. If a sensitivity deviation exceeds the predetermined deviation threshold, it is further determined whether the cause of the sensitivity deviation includes a signal scattering effect and/or a signal radiation effect, and a smart terminal production process is processed according to the determination result, thereby the coupling sensitivity deterioration caused by the signal scattering effect in a new made smart terminal is reduced.

Please refer to FIG. 3, a schematic structural diagram of a terminal for reducing coupling sensitivity deviation according to an embodiment of the application is shown. As shown in FIG. 3, the terminal 30 includes a signal collector 301 and a processor 302 coupled to each other; the processor 302 cooperates with the signal collector 301 to implement the method in any of the embodiments described above during operation.

The terminal 30 is configured to produce a smart terminal with reduced sensitivity deviations, comprising a signal collector 301 and a processor 302 coupled to each other. The signal collector 301 collects sensitivities of different channels to obtain sensitivity deviations between adjacent channels when the sample smart terminal 303 is at a first predetermined position; wherein the first predetermined position is a position where a maximum signal strength can be acquired by an antenna of the sample smart terminal 303. The processor 302 determines whether one of the sensitivity deviations is greater than a predetermined deviation threshold. The processor 302 determines whether a cause of the sensitivity deviation comprises a signal scattering effect and/or a signal radiation effect if one of the sensitivity deviations is determined as greater than the predetermined deviation threshold. The processor 302 drives a smart terminal production process to produce the smart terminal according to determination of the cause.

In a further embodiment of the terminal 30, if the processor 302 determines that the cause comprises the signal scattering effect, the processor 302 redesign a metal film in a flexible circuit board of the smart terminal to have a first thickness less than a skin effect depth of the metal film, and the processor 302 drives the smart terminal production process to deploy the metal film in the flexible circuit board of the smart terminal.

In a further embodiment of the terminal 30, if the processor 302 determines the cause as comprising the signal scattering effect, the processor 302 drives the smart terminal production process to a metal film in a flexible circuit board of the smart terminal with a different metal film having a product of magnetic permeability and electric conductivity less than a preset value, and a skin effect depth greater than that of the metal film.

In a further embodiment of the terminal 30, if the processor 302 determines the cause as comprising the signal radiation effect, the processor 302 further drives the smart terminal production process to coat the flexible circuit board of the smart terminal with an electromagnetic shielding film and connect a motor to the ground.

In a further embodiment of the terminal 30, the signal collector 301 collects sensitivity deviations between adjacent channels when the smart terminal is placed at the first predetermined position after a flexible circuit board of the sample smart terminal 303 is coated with an electromagnetic shielding film and a motor in the sample smart terminal 303 is grounded. The processor 302 determines whether one of the sensitivity deviations is greater than the predetermined deviation threshold, deems the cause as comprising the signal scattering effect if the predetermined deviation threshold is exceeded by one of the sensitivity deviations, and deems the cause as comprising the signal radiation effect if the predetermined deviation threshold is not exceeded by one of the sensitivity deviations.

In a further embodiment of the terminal 30, the sample smart terminal 303 is in a screen-off state when the signal collector 301 collects sensitivities of different channels.

Figure 4:
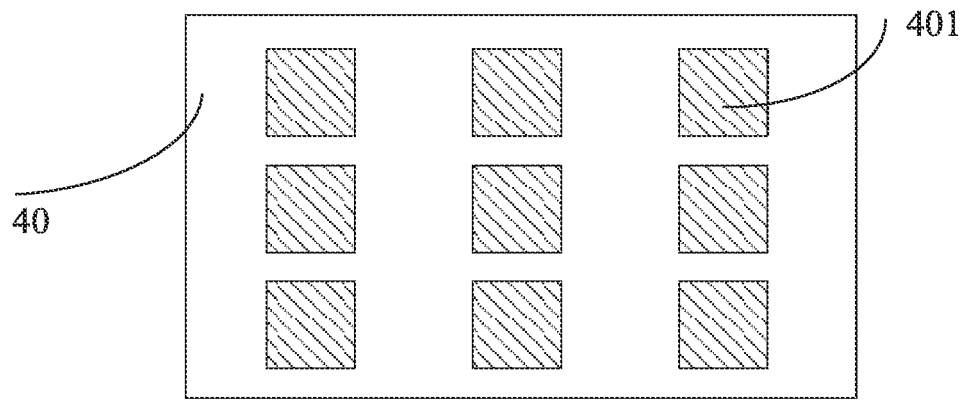
FIG. 4 is a schematic structural diagram an apparatus with storage function according to an embodiment of the present application.

Please refer to FIG. 4, a schematic structural diagram of an apparatus with storage function according to an embodiment of the present application is shown. As shown in FIG. 4, the device 40 stores program data 401 that can be executed to implement the methods in any of the embodiments described above.

In the embodiments provided in the application, it shall be understood that the disclosed method and apparatus may be implemented in alternative ways. For example, the device implementation described above is only illustrative. For example, the division of modules or units is only a division of logical functions. In practical implementations, there may be other divisions, for example, multiple units or components may be combined or integrated into another system, or some features can be ignored, or not implemented. Furthermore, the displayed or discussed mutual coupling or direct coupling or communication connection may be indirect coupling or communication connection through some interfaces, devices, or units, and may be in electrical, mechanical, or other forms.

The units described as separate components may or may not be physically separated, and the components displayed as units may or may not be physical units, that is, they may be located in one place, or may be distributed on multiple network units. Part or all the units may be selected according to actual needs to achieve the objectives of the solutions of the embodiments.

Furthermore, each functional unit in the embodiments described may be integrated into one processing unit, or each unit may exist alone physically, or two or more units are integrated into one unit. The above integrated unit can be implemented in the form of hardware or software function unit.

If the integrated unit is implemented in the form of a software functional unit and sold or used as an independent product, it can be stored in a computer-readable storage medium. Based on such an understanding, the technical solution of the present application may be essentially or part of the contribution to the existing technology or all or part of the technical solution may be embodied in the form of a software product, and the computer software product is stored in a storage medium, Including several instructions to enable a computer device (which may be a personal computer, server, or network device, etc.) or processor to execute all or part of the steps of the methods of the embodiments of the present application. The aforementioned storage media may be one of the following devices: U disk, mobile hard disk, read-only memory (ROM, Read-Only Memory), random access memory (RAM, Random Access Memory), magnetic disk or optical disk and other media that can store program code.

The beneficial effects of the application are as follows. Unlike the prior arts, the present application collects the sensitivity of different channels when the sample smart terminal is at the first predetermined position, obtains sensitivity deviations between adjacent channels, and determines whether a sensitivity deviation between adjacent channels that is greater than the predetermined deviation threshold. It is further determined whether the cause of the sensitivity deviation includes signal scattering and/or a signal radiation effect, and a smart terminal is produced according to the determination result in which the coupling sensitivity deterioration caused by a signal scattering effect is thereby reduced.

The above descriptions are only the embodiments of the present application, and therefore do not limit the scope of patent protection of the present application. Any equivalent structure or equivalent process transformation made by the description and drawings of the application, or directly or indirectly used in other related in the technical field, are included in the scope of patent protection of the application.

What is claimed is:

1. A method for reducing coupling sensitivity deviation, comprising:
   collecting sensitivities of different channels to obtain sensitivity deviations between adjacent channels when a sample smart terminal is at a first predetermined position;
   wherein the first predetermined position is a position where a maximum signal strength can be acquired by an antenna of the sample smart terminal;
   determining whether one of the sensitivity deviations is greater than a predetermined deviation threshold;
   determining whether a cause of the sensitivity deviation comprises a signal scattering effect and/or a signal radiation effect if one of the sensitivity deviations is greater than the predetermined deviation threshold; and
   producing a smart terminal according to determination of the cause.

2. The method for reducing sensitivity deviation as claimed in claim 1, wherein the step of determining whether the cause of the sensitivity deviation comprises the signal scattering effect and/or the signal radiation effect if one of the sensitivity deviations is greater than the predetermined deviation threshold, and producing the smart terminal according to determination of the cause comprises: if the cause comprises the signal scattering effect, redesigning a metal film in a flexible circuit board of the smart terminal to have a first thickness less than a skin effect depth of the metal film.

3. The method for reducing sensitivity deviation as claimed in claim 2, wherein:
   the metal film in the flexible circuit board is a copper film; and
   the first thickness is not greater than 0.2 mm.

4. The method for reducing sensitivity deviation as claimed in claim 2, wherein the flexible circuit board of the smart terminal comprises a display flexible circuit board and/or a large/small flexible circuit board.

5. The method for reducing sensitivity deviation as claimed in claim 4, further comprising:
   determining a dominant signal scattering path from the display flexible circuit board and the large/small flexible circuit board after determining that the cause of the sensitivity deviation comprises the signal scattering effect; and
   deploying the metal film in the display flexible circuit board when the display flexible circuit board is determined as the dominant signal scattering path; and
   deploying the metal film in the large/small flexible circuit board when the large/small flexible circuit board is determined as the dominant signal scattering path.

6. The method for reducing sensitivity deviation as claimed in claim 1, wherein the step of producing the smart terminal according to determination of the cause comprises: if the cause is determined as comprising the signal scattering effect, replacing a metal film in a flexible circuit board of the smart terminal with a different metal film having a product of magnetic permeability and electric conductivity less than a preset value, and a skin effect depth greater than that of the metal film.

7. The method for reducing sensitivity deviation as claimed in claim 1, wherein the step of producing the smart terminal according to determination of the cause comprises: coating a flexible circuit board of the smart terminal with an electromagnetic shielding film and grounding a motor in the smart terminal if the cause is determined as comprising the signal radiation effect.

8. The method for reducing sensitivity deviation as claimed in claim 1, wherein the step of producing the smart terminal according to determination of the cause comprises: wrapping up all clock cables in a flexible circuit board of the smart terminal, and adding a grounded capacitance in parallel to a power line in the smart terminal if the cause is determined as comprising the signal radiation effect.

9. The method for reducing sensitivity deviation as claimed in claim 1, wherein the step of producing the smart terminal according to determination of the cause comprises: if the cause is determined as comprising the signal scattering effect and the signal radiation effect, coating the flexible circuit board of the smart terminal with an electromagnetic shielding film, grounding a motor, and redesigning a metal film in a flexible circuit board of the smart terminal to have a first thickness less than a skin effect depth of the metal film.

10. The method for reducing sensitivity deviation as claimed in claim 1, wherein the step of producing the smart terminal according to determination of the cause comprises:
collecting sensitivity deviations between adjacent channels when the sample smart terminal is at the first predetermined position after coating a flexible circuit board of the sample smart terminal with an electromagnetic shielding film and grounding a motor;
determining whether one of the sensitivity deviations is greater than the predetermined deviation threshold;
deeming the cause as comprising the signal scattering effect if the predetermined deviation threshold is exceeded by a sensitivity deviation; and
deeming the cause as comprising the signal radiation effect if the predetermined deviation threshold is not exceeded by a sensitivity deviation.

11. The method for reducing sensitivity deviation as claimed in claim 1, wherein the step of collecting is performed when the sample smart terminal is in a screen-off state.

12. A terminal, configured to produce a smart terminal with reduced sensitivity deviations, comprising:
a signal collector and a processor coupled to each other and a sample smart terminal; wherein:
the signal collector collects sensitivities of different channels to obtain sensitivity deviations between adjacent channels when the sample smart terminal is at a first predetermined position; wherein the first predetermined position is a position where a maximum signal strength can be acquired by an antenna of the sample smart terminal;
the processor determines whether one of the sensitivity deviations is greater than a predetermined deviation threshold;
the processor determines whether a cause of the sensitivity deviation comprises a signal scattering effect and/or a signal radiation effect if one of the sensitivity deviations is determined as greater than the predetermined deviation threshold; and
the processor drives a smart terminal production process to produce the smart terminal according to determination of the cause.

13. The terminal as claimed in claim 12, wherein:
if the processor determines that the cause comprises the signal scattering effect, the processor redesign a metal film in a flexible circuit board of the smart terminal to have a first thickness less than a skin effect depth of the metal film; and
the processor drives the smart terminal production process to deploy the metal film in the flexible circuit board of the smart terminal.

14. The terminal as claimed in claim 13, wherein:
the metal film in the flexible circuit board is a copper film, and
the first thickness is not greater than 0.2 mm.

15. The terminal as claimed in claim 13, wherein the flexible circuit board of the smart terminal comprises one or more of a display flexible circuit board and a large/small flexible circuit board.

16. The terminal as claimed in claim 12, wherein: if the processor determines the cause as comprising the signal scattering effect, the processor drives the smart terminal production process to replace a metal film in a flexible circuit board of the smart terminal with a different metal film having a product of magnetic permeability and electric conductivity less than a preset value, and a skin effect depth greater than that of the metal film.

17. The terminal as claimed in claim 12, wherein: if the processor determines the cause as comprising the signal radiation effect, the processor further drives the smart terminal production process to coat the flexible circuit board of the smart terminal with an electromagnetic shielding film and connect a motor in the smart terminal to the ground.

18. The terminal as claimed in claim 17, wherein:
the signal collector collects sensitivity deviations between adjacent channels when the smart terminal is placed at the first predetermined position after a flexible circuit board of the sample smart terminal is coated with an electromagnetic shielding film and a motor in the sample smart terminal is grounded;
the processor determines whether one of the sensitivity deviations is greater than the predetermined deviation threshold;
the processor deems the cause as comprising the signal scattering effect if the predetermined deviation threshold is exceeded by one of the sensitivity deviations; and
the processor deems the cause as comprising the signal radiation effect if the predetermined deviation threshold is not exceeded by one of the sensitivity deviations.

19. The terminal as claimed in claim 12, wherein the sample smart terminal is in a screen-off state.

20. An apparatus having a storage function, storing program data being executable to perform the steps of:
collecting sensitivities of different channels to obtain sensitivity deviations between adjacent channels when a sample smart terminal is at a first predetermined position;
wherein the first predetermined position is a position where a maximum signal strength can be acquired by an antenna of the sample smart terminal;
determining whether one of the sensitivity deviations is greater than a predetermined deviation threshold;
determining whether a cause of the sensitivity deviation comprises the signal scattering effect and/or a signal radiation effect if one of the sensitivity deviations is greater than the predetermined deviation threshold; and
producing the sample smart terminal according to determination of the cause.

* * * * *